(12) United States Patent
Manfrini

(10) Patent No.: US 12,075,710 B2
(45) Date of Patent: Aug. 27, 2024

(54) THREE-STATE MEMORY DEVICE

(71) Applicant: Taiwan Semiconductor Manufacturing Company, Ltd., Hsinchu (TW)

(72) Inventor: Mauricio Manfrini, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 363 days.

(21) Appl. No.: 17/412,509

(22) Filed: Aug. 26, 2021

(65) Prior Publication Data
US 2023/0068094 A1    Mar. 2, 2023

(51) Int. Cl.
| | |
|---|---|
| H10N 50/80 | (2023.01) |
| H01L 23/522 | (2006.01) |
| H10B 61/00 | (2023.01) |
| H10N 50/01 | (2023.01) |
| H10N 50/10 | (2023.01) |

(52) U.S. Cl.
CPC ......... *H10N 50/80* (2023.02); *H01L 23/5226* (2013.01); *H10B 61/00* (2023.02); *H10N 50/01* (2023.02); *H10N 50/10* (2023.02)

(58) Field of Classification Search
CPC ........ H10N 50/80; H10N 50/01; H10N 50/10; H01L 23/5226; H01L 23/528; H10B 61/00
See application file for complete search history.

(56) References Cited

U.S. PATENT DOCUMENTS

| | | | |
|---|---|---|---|
| 6,751,149 B2 | 6/2004 | Seyyedy et al. | |
| 10,497,867 B1 | 12/2019 | Trinh | |
| 2021/0005807 A1* | 1/2021 | Kwon | H10B 61/10 |
| 2022/0013714 A1* | 1/2022 | Park | H10N 50/10 |

OTHER PUBLICATIONS

Zhu et al. "Comprehensive Reliability Study of STT-MRAM Devices and Chips for Last Level Cache Applications (LLC) at 0x Nodes." IEEE 2019 International Symposium on VLSI Technology, Systems and Application (VLSI-TSA), published on Aug. 19, 2019.
Dieny et al. "Special MRAM Poster Session." IEDM conference, published on Dec. 5, 2018.

* cited by examiner

*Primary Examiner* — Shih Tsun A Chou
(74) *Attorney, Agent, or Firm* — Eschweiler & Potashnik, LLC

(57) ABSTRACT

The present disclosure relates to an integrated chip including a bottom electrode arranged within a dielectric layer. A memory element is directly over the bottom electrode and is arranged within the dielectric layer. A top electrode is directly over the memory element and is arranged within the dielectric layer. A conductive via is directly over the top electrode. A pair of lines that extend along opposing sidewalls of the top electrode are directly over, and intersect, an uppermost surface of the memory element. The pair of lines are directly under, and intersect, a lowermost surface of the via.

20 Claims, 11 Drawing Sheets ns of a memory device comprising a top electrode over
THREE-STATE MEMORY DEVICE

BACKGROUND

Many modern day electronic devices contain electronic memory. Electronic memory may be volatile memory or non-volatile memory. Non-volatile memory is able to store data in the absence of power, whereas volatile memory is not. Some examples of next generation electronic memory include magnetoresistive random-access memory (MRAM), resistive random-access memory (RRAM), phase-change random-access memory (PCRAM), and conductive-bridging random-access memory (CBRAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
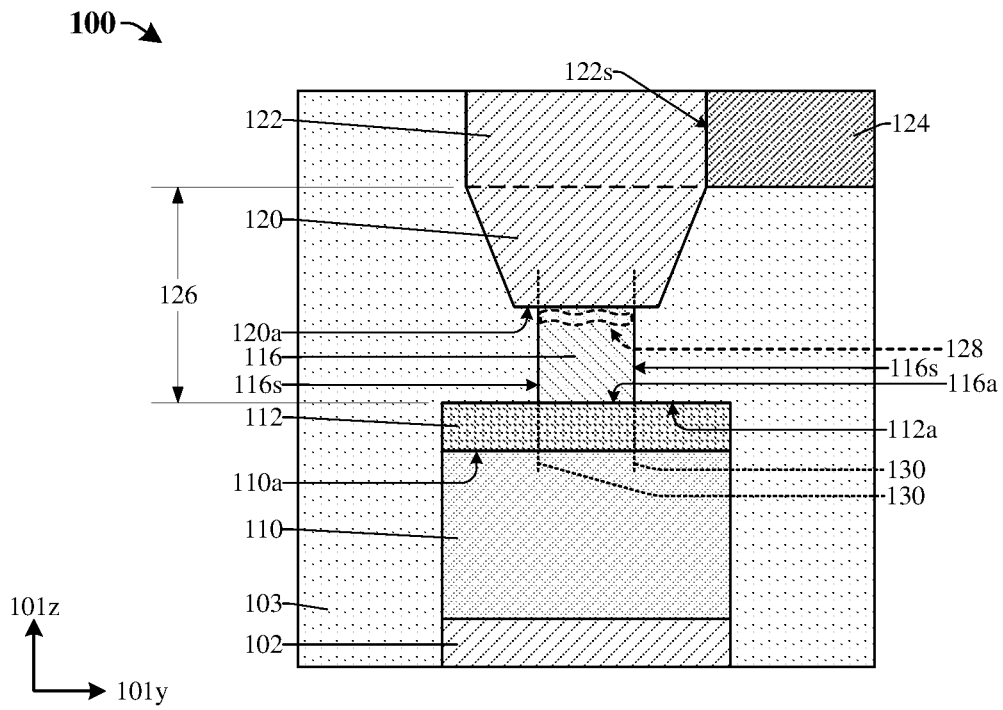
FIG. 1 illustrates a cross-sectional view of some embodiments of a memory device comprising a top electrode over a memory element, the top electrode configured to create an open circuit in the memory device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many integrated chips include memory devices. A memory device may include a plurality of memory elements arranged in an array comprising a number of rows and columns. For example, a memory element may include a magnetic tunnel junction (MTJ) or the like.

In some instances, one or more memory elements in a memory device may fail over time. As a result, the row and/or column in which the failed element resides may be discarded. This may result in all of the memory elements in the respective row and/or column going unused, even if those elements have not failed. Thus, a plurality of working memory elements may be wasted in this process.

To mitigate this issue, some memory elements are configured to have three different operating states. For example, a memory element may be configured to have a low resistance state (e.g., a logic "1"), a high resistance state (e.g., a logic "0"), and a short circuit state (e.g., a very low resistance state). In some instances, the memory device may be able to disregard memory elements exhibiting the short circuit state without discarding the other elements in the row and/or column. In other words, working memory elements in a row and/or column that contains a failed element may not have to be wasted. Thus, memory element waste may be minimized and memory density may be increased.

However, a challenge with these memory devices is that the short circuit state may have highly variable resistance. For example, different memory elements in the short circuit state may have a number of different low resistances. Further, in some instances, the short circuit state may result in a resistance that is similar to the low resistance state (e.g., the logic "1" state). This high variability may make it difficult for the memory device to identify which state each memory element is in. Thus, a performance and/or a reliability of the memory device may be low.

Various embodiments of the present disclosure are related to a memory device comprising a breakable top electrode over a memory element for improving a performance of the memory device. The memory device comprises a memory element directly over a bottom electrode. A top electrode is directly over the memory element. A width of the top electrode is less than a width of the memory element. A conductive via is directly over the top electrode. A first conductive line is directly over the conductive via. A source line is adjacent to the first conductive line. The source line is electrically coupled to the top electrode through the first conductive line and the conductive via.

The memory device may read and write the memory element by providing a read signal and a write signal, respectively, to the memory element. In some instances, if the memory device detects that the memory element has failed, the source line is configured to provide a breakdown signal to the top electrode. The breakdown signal has a voltage that is higher than a voltage of the read signal and/or a voltage of the write signal. Further, the voltage of the breakdown signal is high enough to cause the top electrode to break (e.g., by way of electromigration) and create an open circuit. By creating an open circuit in series with the failed memory element (i.e., by creating an open circuit state), the memory device may be able to disregard the failed memory element without discarding any other elements in a same row and/or column as the failed memory element. Further, the open circuit state may have little or no variability (e.g., relative to a short circuit state). Furthermore, the open circuit state may exhibit a very large resistance (e.g., much higher than that of a logic "0" high resistance state), thereby reducing a difficulty for the memory device to identify which state each memory element is exhibiting. Thus, a performance and/or a reliability of the memory device may be improved.

FIG. 1 illustrates a cross-sectional view 100 of some embodiments of a memory device comprising a top electrode 116 over a memory element 110, the top electrode 116 configured to create an open circuit in the memory device. In some embodiments, the cross-sectional view 100 of FIG. 1 may, for example, be taken across line A-A' of FIG. 3. In some embodiments, FIG. 1 is illustrated in a z-y plane (see, for example, z-axis 101z and y-axis 101y).

The memory device comprises a bottom electrode 102 arranged within a dielectric structure 103. The memory element 110 is arranged within the dielectric structure 103 and is directly over the bottom electrode 102. In some embodiments, the memory element 110 may, for example, be or comprise a magnetoresistive memory element (e.g., a magnetic tunnel junction (MTJ) or the like), a phase-change memory element, a resistive memory element, or some other suitable type of memory element. In some embodiments, a hard mask 112 is arranged within the dielectric structure 103 and is directly over the memory element 110.

The top electrode 116 is arranged within the dielectric structure 103 and is directly over the hard mask 112. In some embodiments, a lowermost surface 116a of the top electrode 116 is on an uppermost 112a surface of the hard mask 112. In some embodiments, the dielectric structure 103 laterally surrounds the top electrode 116, and the dielectric structure 103 is on the uppermost surface 112a of the hard mask 112.

A width of the top electrode 116 is less than a width of the memory element 110. For example, in some embodiments, a pair of vertical lines 130 that extend along opposing sidewalls 116s of the top electrode 116 are directly over, and intersect, an uppermost surface 110a of the memory element 110. In some embodiments, the pair of vertical lines 130 are also directly under, and intersect, a lowermost surface 120a of the conductive via 120. In some embodiments, the pair of vertical lines 130 are also directly over, and intersect, the uppermost surface 112a of the hard mask 112. In some embodiments, a ratio of the width of the top electrode 116 to the width of the memory element 110 is less than 1, is less than 0.5, is about 0.1 to 0.5, or is some other suitable value.

A conductive via 120 is arranged within the dielectric structure 103 and is directly over the top electrode 116. A first conductive line 122 is arranged within the dielectric structure 103 and is directly over the conductive via 120. The first conductive line 122 is disposed at a first height 126 over the memory element 110.

A source line 124 is arranged within the dielectric structure 103 and is adjacent to the first conductive line 122. In some embodiments, the source line 124 is also disposed at the first height 126. In some embodiments, the source line 124 is arranged on a sidewall 122s of the first conductive line 122. The source line 124 is electrically coupled to the top electrode 116 through the first conductive line 122 and the conductive via 120.

The source line 124 is configured (e.g., if the memory device detects that the memory element 110 has failed) to provide a breakdown signal to the top electrode 116. A voltage of the breakdown signal is higher than a voltage of a read signal for reading the memory element 110, and is higher than a voltage of a write signal for writing to the memory element 110. Further, the voltage of the breakdown signal is high enough (e.g., greater than about 3 volts or some other suitable value) to cause the top electrode 116 to break (e.g., experience electromigration), thereby creating an open circuit in the path between the bottom electrode 102 and the conductive via 120. In some embodiments, as a result of the electromigration, a void (e.g., as illustrated by dashed region 128) may exist somewhere along the top electrode 116, and the void may separate the top electrode 116 from the conductive via 120 and/or from another portion of the top electrode 116 (i.e., the void may exist at the open circuit and/or may establish the open circuit).

By creating an open circuit in series with the memory element 110, the memory device may be able to disregard the memory element 110 without discarding any other memory elements (not shown) in a same row and/or column as the memory element 110. Further, the open circuit state may have little or no variability (e.g., relative to a short circuit state). Furthermore, the open circuit state may exhibit a very large resistance (e.g., much higher than that of a logic "0" high resistance state), thereby reducing a difficulty for the memory device to identify which state each memory element is exhibiting. Thus, a performance and/or a reliability of the memory device may be improved.

Further, because the top electrode 116 has a small width (e.g., because the ratio of the width of the top electrode 116 to the width of the memory element 110 is less than 1, is less than 0.5, is about 0.1 to 0.5, or some other suitable value), the voltage across the top electrode 116 that is provided by the source line 124 may more easily break the top electrode 116. In other words, the source line 124 may need to provide a lower voltage to break the top electrode 116 than would otherwise be necessary if the top electrode 116 had a larger width. Thus, a performance of the memory device may be further improved.

In some embodiments, the void (e.g., 128) may exist at an interface between the top electrode 116 and the conductive via 120. In some embodiments, the void may be or comprise one or more air gaps. For example, in some embodiments, the void may comprise air, a combination of air and some metal residue, or the like.

Figure 2:
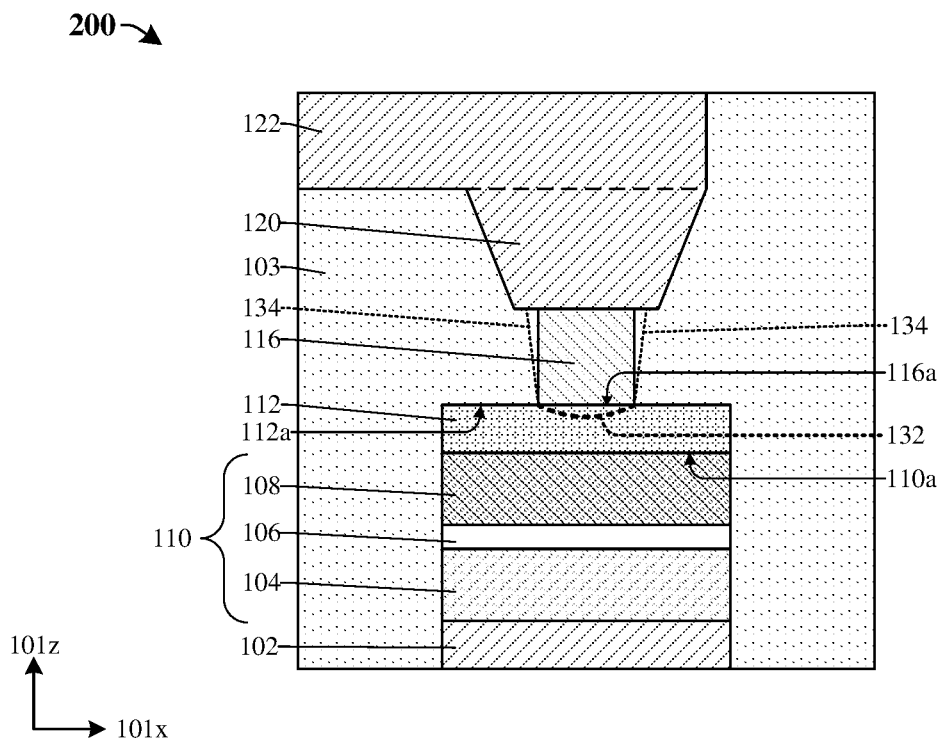
FIG. 2 illustrates a cross-sectional view of some embodiments of the memory device of FIG. 1 in which the memory element comprises multiple layers.

FIG. 2 illustrates a cross-sectional view 200 of some embodiments of the memory device of FIG. 1 in which the memory element 110 comprises multiple layers. In some embodiments, the cross-sectional view 200 of FIG. 1 may, for example, be taken across line B-B' of FIG. 3. In some embodiments, FIG. 2 is illustrated in a z-x plane (see, for example, z-axis 101z and x-axis 101x).

In some embodiments, the memory element 110 comprises a magnetic reference layer 104, a tunnel barrier layer 106 directly over the magnetic reference layer 104, and a magnetic free layer 108 directly over the tunnel barrier layer 106. In some embodiments, the hard mask 112 vertically separates a lowermost surface 116a of the top electrode 116 from an uppermost surface 110a of the memory element 110.

In some embodiments, the top electrode 116 may have a curved lowermost surface (e.g., as illustrated by dashed line 132). In such embodiments, the curved lowermost surface of the top electrode 116 is below an uppermost surface 112a of the hard mask 112. In other words, in such embodiments, the curved lowermost surface of the top electrode 116 extends into a top of the hard mask 112. Further, in such embodiments, the hard mask 112 has a curved upper surface that abuts the curved lowermost surface of the top electrode 116.

In some embodiments, one or more sidewalls of the top electrode 116 are tapered (e.g., as illustrated by a dashed lines 134). In other words, in such embodiments, an angle between the one or more sidewalls of the top electrode 116 and a lowermost surface 116a of the top electrode 116 is greater than 90 degrees. In yet other words, in such embodiments, a width of the top electrode 116 may increase along the height of the top electrode 116.

Figure 3:
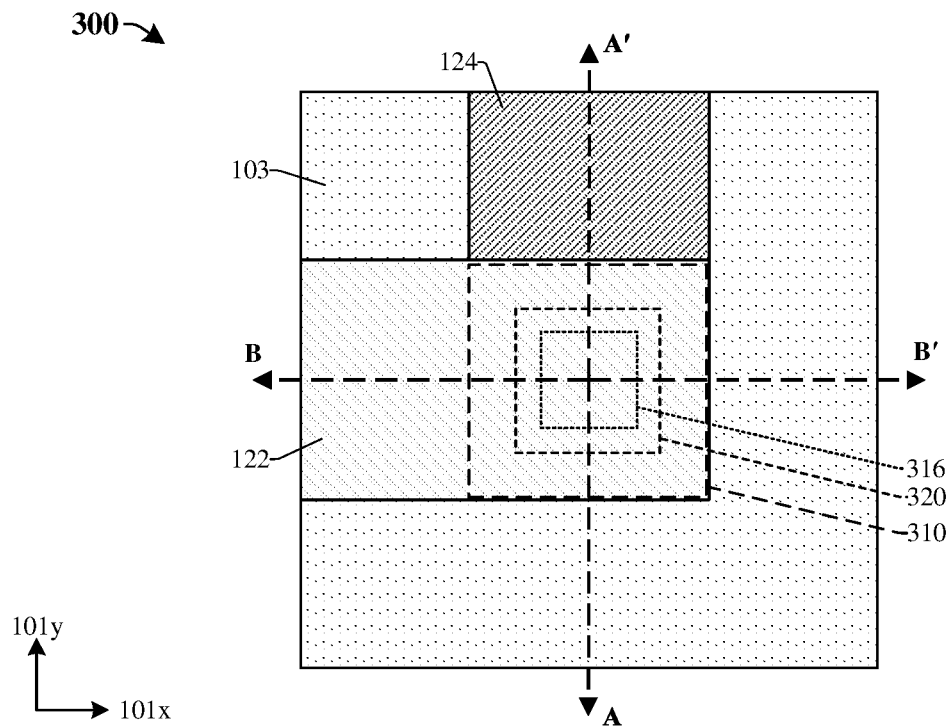
FIG. 3 illustrates a top view of some embodiments of the memory device of FIGS. 1 and 2.

FIG. 3 illustrates a top view 300 of some embodiments of the memory device of FIGS. 1 and 2. In some embodiments, FIG. 3 is illustrated in a y-x plane (see, for example, y-axis 101y and x-axis 101x).

In some embodiments, a first perimeter 316 of a lowermost surface of the top electrode (not shown) is arranged within a second perimeter 310 of an uppermost surface of the memory element (not shown). Further, in some embodiments, the first perimeter 316 is also arranged within a third perimeter 320 of a lowermost surface of the conductive via (not shown).

In some embodiments, the first conductive line 122 is elongated in a first direction (e.g., along the x-axis 101x) while the source line 124 is elongated in a second direction (e.g., along the y-axis 101y) transverse to the first direction.

Figure 4:
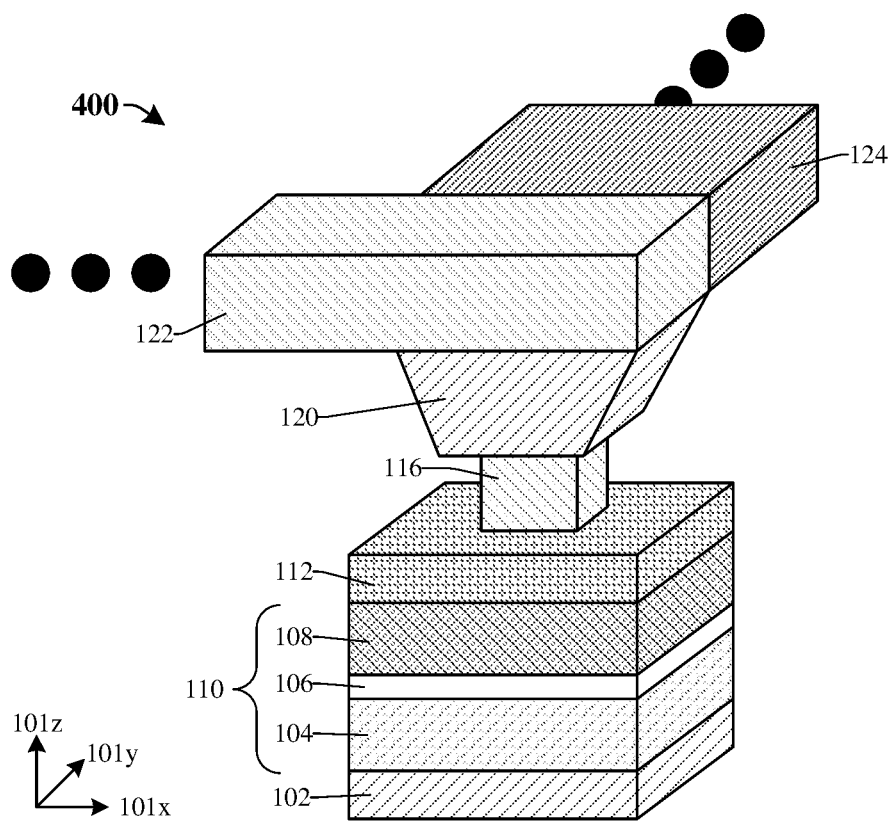
FIG. 4 illustrates a three-dimensional view of some embodiments of the memory device of FIG. 1.

FIG. 4 illustrates a three-dimensional view 400 of some embodiments of the memory device of FIG. 1.

In some embodiments, the bottom electrode 102, the memory element 110, the hard mask 112, and the top electrode 116 may be shaped like rectangular prisms, as illustrated in FIG. 4. However, it will be appreciated that in some alternative embodiments, the bottom electrode 102, the memory element 110, the hard mask 112, and the top electrode 116 may alternatively have cylindrical shapes.

In some embodiments, the bottom electrode 102 may, for example, comprise titanium nitride, tantalum nitride, tungsten, copper, or some other suitable conductive material. In some embodiments, a width of the bottom electrode 102 (e.g., along the y-axis 101y) may, for example, be about 20 nanometers to 50 nanometers or some other suitable value. In some embodiments, a thickness of the bottom electrode 102 (e.g., along the z-axis 101z) may, for example, be about 20 nanometers to about 100 nanometers or some other suitable value.

In some embodiments, a width of the memory element 110 may, for example, be about 20 nanometers to 50 nanometers or some other suitable value. In some embodiments, a thickness of the memory element 110 may, for example, be about 10 nanometers to 30 nanometers or some other suitable value.

In some embodiments, the magnetic reference layer 104 and/or the magnetic free layer 108 may, for example, comprise a cobalt-iron-boron alloy, or some other suitable material. In some embodiments, the tunnel barrier layer 106 may, for example, comprise magnesium oxide, aluminum oxide, or some other suitable material.

In some embodiments, the hard mask 112 may, for example, comprise titanium nitride or some other suitable conductive material. In some embodiments, a width of the hard mask 112 may, for example, be about 20 nanometers to 50 nanometers or some other suitable value. In some embodiments, a thickness of the hard mask 112 may, for example, be about 50 nanometers to 150 nanometers or some other suitable value.

In some embodiments, the top electrode 116 may, for example, comprise copper, a copper-aluminum alloy, or some other suitable material. In some embodiments, a width of the top electrode 116 may, for example, be about 5 nanometers to 10 nanometers or some other suitable value. In some embodiments, a thickness of the top electrode 116 may, for example, be about 10 nanometers to 50 nanometers or some other suitable value.

In some embodiments, the conductive via 120, the first conductive line 122, and/or the source line 124 may, for example, comprise titanium nitride, tantalum nitride, tungsten, copper, or some other suitable conductive material. In some embodiments, a width of the conductive via 120 may, for example, be about 10 nanometers to 40 nanometers or some other suitable value. In some embodiments, a thickness of the conductive via 120 may, for example, be about 10 nanometers to about 50 nanometers or some other suitable value.

In some embodiments, the dielectric structure (e.g., 103 of FIG. 3) may, for example, comprise one or more dielectric layers (see, for example, first dielectric layer 114 and/or second dielectric layer 118 of FIG. 2I). In some embodiments, the one or more dielectric layers may, for example, comprise silicon dioxide, silicon nitride, silicon carbide, silicon oxycarbide, silicon oxynitride, or some other suitable material.

It should be noted that the dielectric structure (103 of FIG. 3) is not shown in FIG. 4 for simplicity and clarity of illustration.

Figure 5:
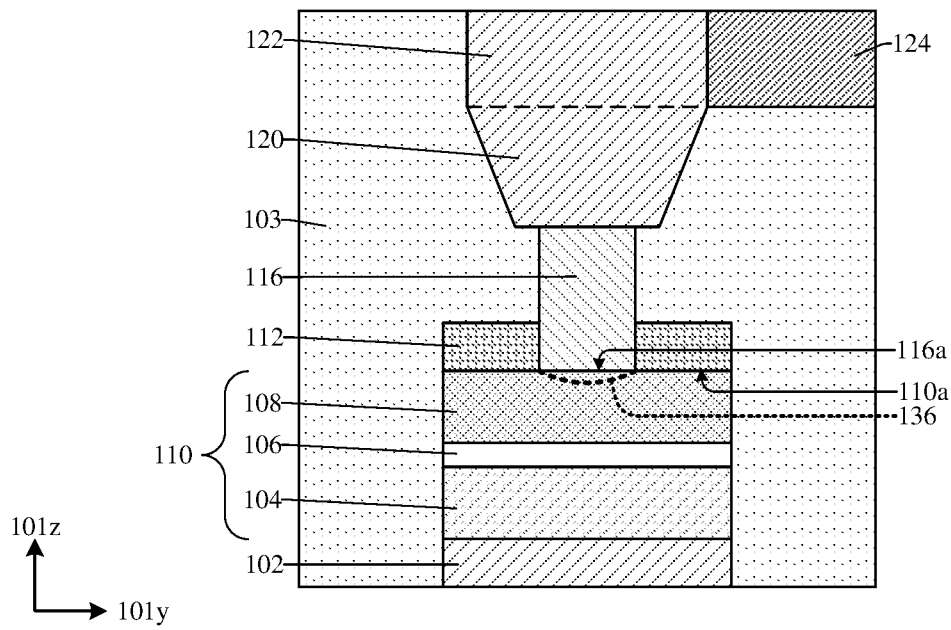
FIG. 5 illustrates a cross-sectional view of some embodiments of the memory device of FIG. 1 in which the top electrode extends through a hard mask to an uppermost surface of the memory element.

FIG. 5 illustrates a cross-sectional view 500 of some embodiments of the memory device of FIG. 1 in which the top electrode 116 extends through a hard mask 112 to an uppermost surface 110a of the memory element 110.

In such embodiments, sidewalls of the top electrode 116 are on sidewalls of the hard mask. In some embodiments, the top electrode 116 is in direct contact with the memory element 110 (e.g., with the magnetic free layer 108). In some embodiments, a lowermost surface 116a of the top electrode 116 is on an uppermost surface 110a of the memory element 110 (e.g., on an uppermost surface of the magnetic free layer).

In some other embodiments, the top electrode 116 may have a curved lowermost surface (e.g., as illustrated by dashed line 136). In such embodiments, the curved lowermost surface of the top electrode 116 is below the uppermost surface 110a of the memory element 110 (e.g., below an uppermost surface of the magnetic free layer 108). In other words, in such embodiments, the curved lowermost surface of the top electrode 116 extends into a top of the memory element 110 (e.g., into a top of the magnetic free layer 108). Further, in such embodiments, the memory element 110 (e.g., the magnetic free layer 108) has a curved upper surface that abuts the curved lowermost surface of the top electrode 116.

Figure 6:
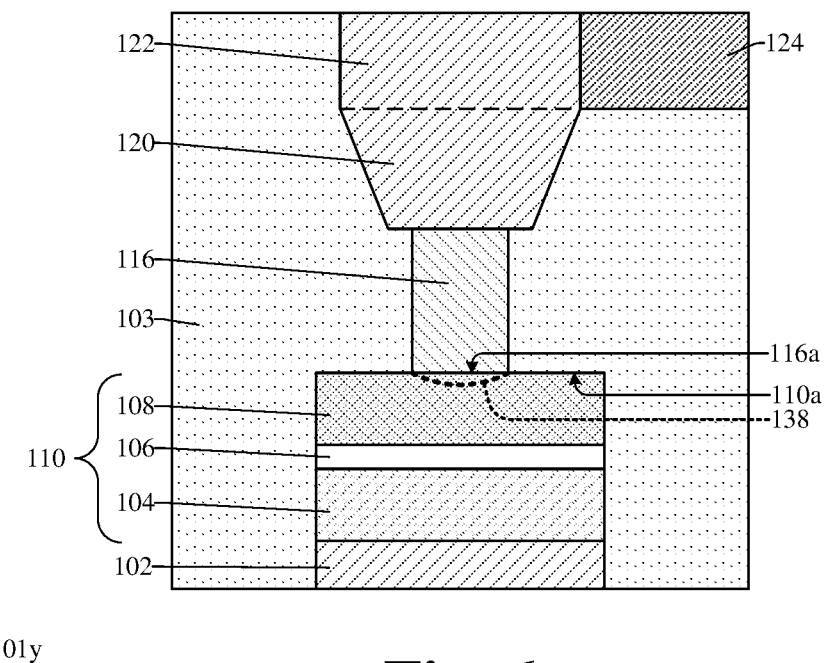
FIG. 6 illustrates a cross-sectional view of some embodiments of the memory device of FIG. 1 in which a dielectric structure is on an uppermost surface of the memory element.

FIG. 6 illustrates a cross-sectional view 600 of some embodiments of the memory device of FIG. 1 in which a dielectric structure 103 is on an uppermost surface 110a of the memory element 110.

In such embodiments, the memory device is devoid of the hard mask (e.g., 112 of FIG. 1). In some embodiments, the dielectric structure 103 is in direct contact with the uppermost surface 110a of the memory element 110.

In some embodiments, a lowermost surface 116a of the top electrode 116 is on an uppermost surface 110a of the memory element (e.g., on an uppermost surface of the magnetic free layer 108). In some other embodiments, the top electrode 116 may have a curved lowermost surface (e.g., as illustrated by dashed line 138) that extends below the uppermost surface 110a of the memory element 110 (e.g., below the uppermost surface of the magnetic free layer 108).

Figure 7:
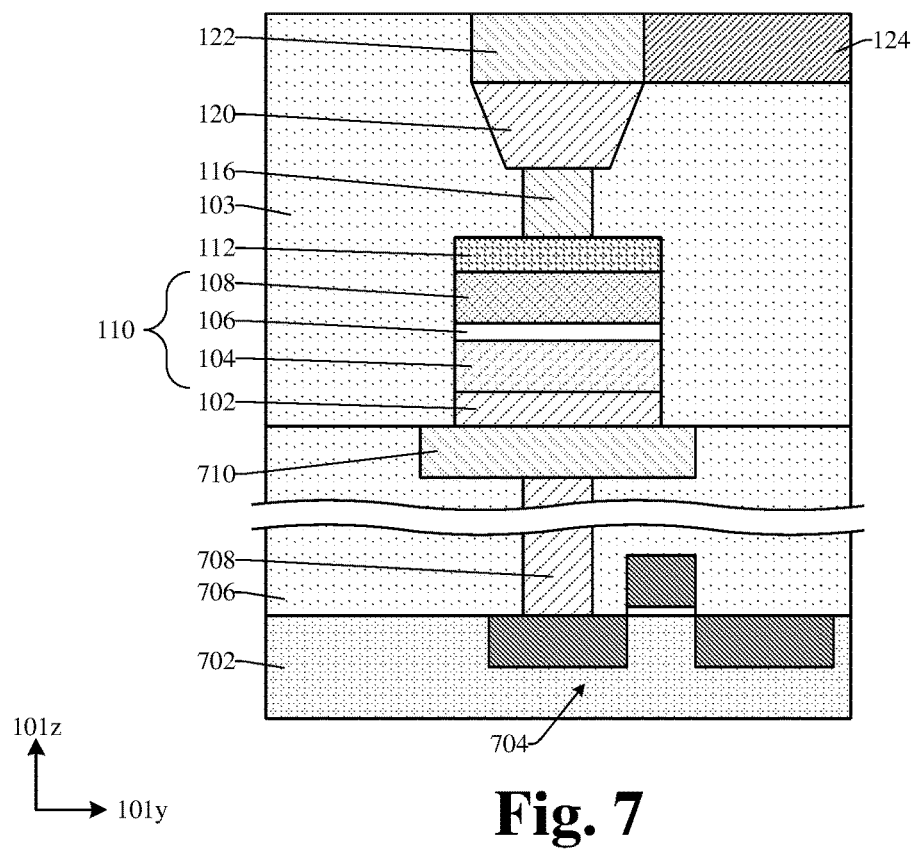
FIG. 7 illustrates a cross-sectional view of some embodiments of an integrated chip comprising the memory device of FIG. 1 arranged over a substrate.

FIG. 7 illustrates a cross-sectional view 700 of some embodiments of an integrated chip comprising the memory device of FIG. 1 arranged over a substrate 702.

In some embodiments, a semiconductor device 704 is arranged along the substrate 702, one or more dielectric layers 706 are over the substrate 702, one or more conductive interconnects 708 (e.g., contacts, vias, wires, or the like) are within the one or more dielectric layers 706, and a landing pad 710 is over the one or more conductive interconnects 708. In some embodiments, the bottom electrode 102 may be in direct contact with the landing pad 710. In some embodiments, the memory element 110 may be electrically coupled to the semiconductor device 704 through the bottom electrode 102, the landing pad 710, and the one or more conductive interconnects 708.

Figure 8:
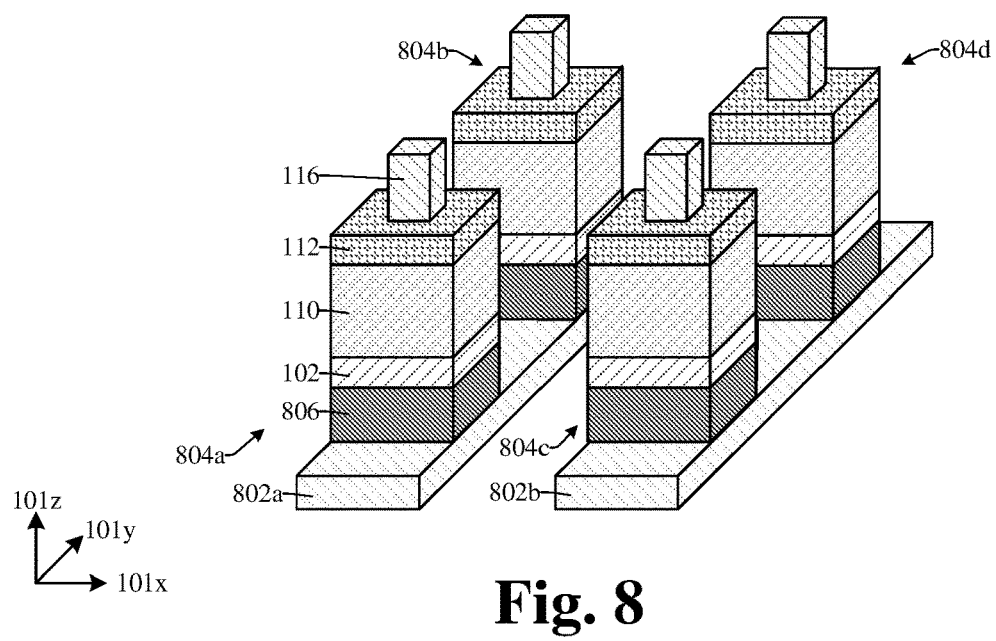
FIG. 8 illustrates a three-dimensional view of some embodiments of a memory array comprising a plurality of memory cells.

FIG. 8 illustrates a three-dimensional view 800 of some embodiments of a memory array comprising a plurality of memory cells 804a-d.

In some embodiments, a first word line 802a and a second word line 802b extend along a first axis (e.g., y-axis 101y). The second word line 802b is adjacent to the first word line 802a and is spaced apart from the first word line 802a. In some embodiments, a first memory cell 804a and a second memory cell 804b are directly over the first word line 802a, while a third memory cell 804c and a fourth memory cell 804d are directly over the second word line 802b.

In some embodiments, the first memory cell 804a, the second memory cell 804b, the third memory cell 804c, and the fourth memory cell 804d each comprise a bottom electrode 102, a memory element 110 directly over the bottom electrode 102, a hard mask 112 directly over the memory element 110, and a top electrode 116 directly over the hard mask 112. In some embodiments, each of the memory cells (e.g., 804a-d) further comprise a selector 806.

Although FIG. 8 does not show features overlying the top electrodes 116, it will be appreciated that in some embodiments, the top electrodes 116 are electrically coupled to overlying conductive features (not shown). For example, in such embodiments, the overlying conductive features may include one or more first conductive lines (e.g., 122 of FIG. 1) and one or more source lines (e.g., 124 of FIG. 1) coupled to the one or more first conductive lines, as illustrated, for example, in FIG. 1. Further, although FIG. 8 illustrates a four cell memory array, it will be appreciated that in some other embodiments, arrays of other sizes are also feasible.

FIGS. 9-21 illustrate cross-sectional views 900-2100 of some embodiments of a method for forming a memory device comprising a top electrode 116 over a memory element 110 and a source line 124 coupled to the top electrode 116. Although FIGS. 9-21 are described in relation to a method, it will be appreciated that the structures disclosed in FIGS. 9-21 are not limited to such a method, but instead may stand alone as structures independent of the method.

Figure 9:
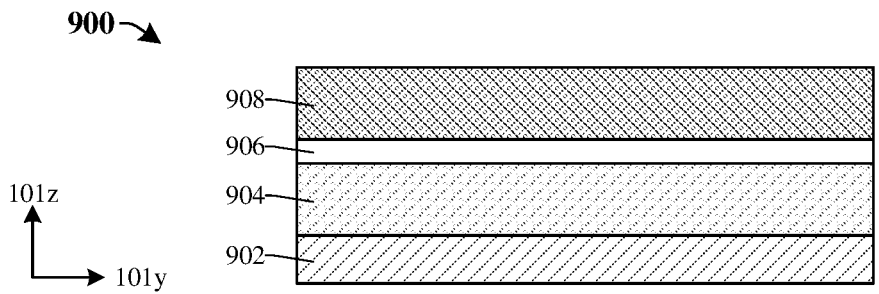
FIGS. 9-21 illustrate cross-sectional views of some embodiments of a method for forming a memory device comprising a top electrode over a memory element and a source line coupled to the top electrode.

As shown in cross-sectional view 900 of FIG. 9, a first magnetic layer 904 is formed directly over a first conductive layer 902, an insulator layer 906 is formed directly over the first magnetic layer 904, and a second magnetic layer 908 is formed directly over the insulator layer 906.

In some embodiments, the first conductive layer 902 may, for example, comprise titanium nitride, tantalum nitride, tungsten, copper, or some other suitable material. In some embodiments, the first magnetic layer 904 and/or the second magnetic layer 908 may, for example, be formed by depositing a cobalt-iron-boron alloy or some other suitable material by a sputtering process or some other suitable process. In some embodiments, the insulator layer 906 may, for example, be formed by depositing magnesium oxide, aluminum oxide, or some other suitable material by a chemical vapor deposition (CVD) process, a physical vapor deposition (PVD) process, an atomic layer deposition (ALD) process, or some other suitable process.

Figure 10:
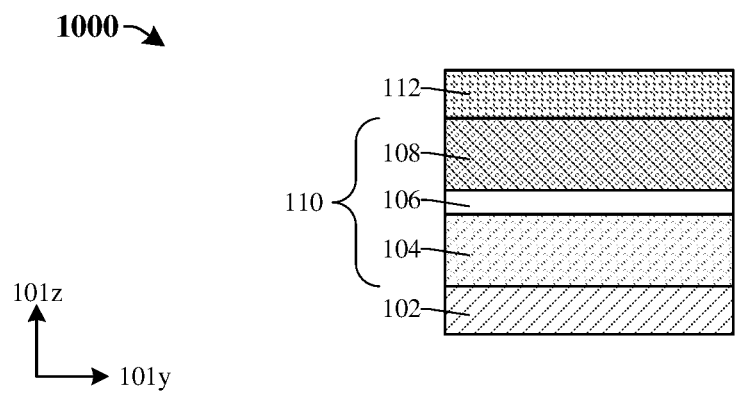

As shown in cross-sectional view 1000 of FIG. 10, a hard mask 112 is formed directly over the second magnetic layer (e.g., 908 of FIG. 9). The second magnetic layer (e.g., 908 of FIG. 9), the insulator layer (e.g., 906 of FIG. 9), the first magnetic layer (e.g. 904 of FIG. 9), and the first conductive layer (e.g., 902 of FIG. 9) are then etched according to the hard mask 112 to form a bottom electrode 102 from the first conductive layer and to form a memory element 110 from the first magnetic layer, the insulator layer, and the second magnetic layer. For example, the etching forms a magnetic reference layer 104 from the first magnetic layer, a tunnel barrier layer 106 from the insulator layer, and a magnetic free layer 108 from the second magnetic layer.

In some embodiments, the etching may, for example, comprise a dry etching process (e.g., a reactive ion etching process, an ion beam etching process, or the like) or some other suitable etching process.

In some embodiments, the hard mask 112 may, for example, be formed by depositing titanium nitride or some other suitable hard mask material by a CVD process, a PVD process, an ALD process, a sputtering process, or some other suitable process, and by patterning the hard mask material by a photolithography process or some other suitable process. In some embodiments, the hard mask 112 is removed from over the memory element 110 after the etching (see, for example, FIG. 6).

Although FIGS. 9 and 10 illustrate forming an MTJ, it will be appreciated that in some alternative embodiments, some other type of memory element may alternatively be formed over the bottom electrode 102. For example, in some alternative embodiments, one or more data storage layers may be formed over a first conductive layer and may be patterned to form a memory element.

Figure 11:
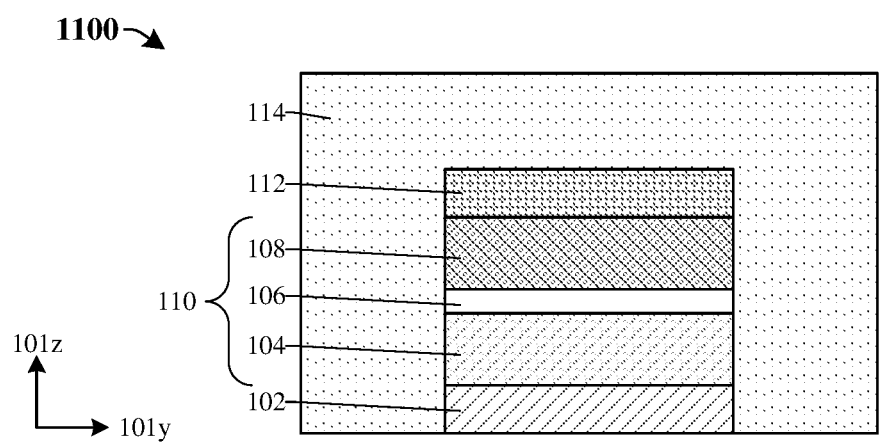

As shown in cross-sectional view 1100 of FIG. 11, a first dielectric layer 114 is formed directly over the hard mask 112 and surrounding the memory element 110. In some embodiments, the first dielectric layer 114 may, for example, be formed by depositing silicon dioxide, silicon nitride, silicon carbide, silicon oxycarbide, silicon oxynitride, or some other suitable material by a CVD process, a PVD process, an ALD process, or some other suitable process.

Figure 12:
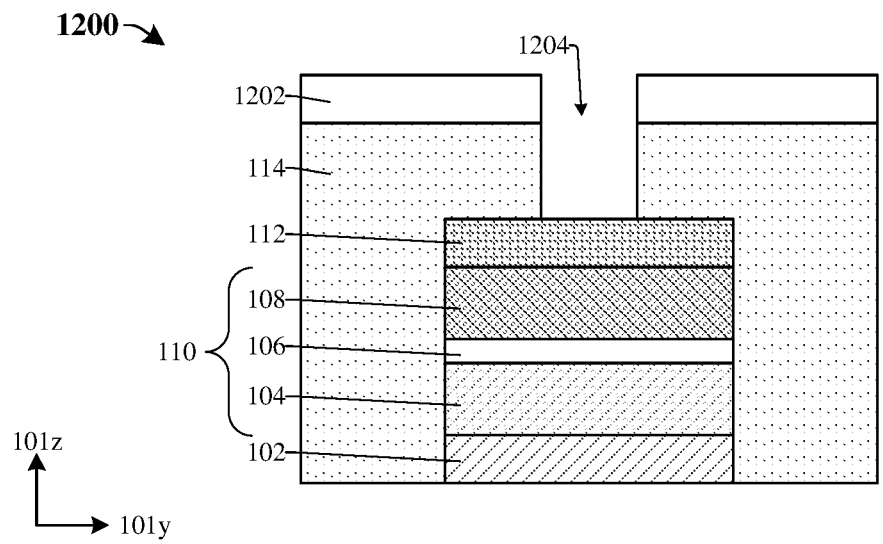

As shown in cross-sectional view 1200 of FIG. 12, a first masking layer 1202 is formed directly over the first dielectric layer 114. The first dielectric layer 114 is then etched according to the first masking layer 1202 to form a first opening 1204 in the first dielectric layer 114. In some embodiments, the first opening 1204 is directly over the hard mask 112 and uncovers an upper surface of the hard mask 112.

In some embodiments, the first masking layer 1202 may, for example, be or comprise a photoresist mask, a hard mask, or the like. In some embodiments, the etching may, for example, comprise a dry etching process or some other suitable process. In some embodiments, the first masking layer 1202 is removed after the etching.

In some embodiments, the etch, and thus the first opening 1204, may extend into the hard mask 112 (see, for example, 132 of FIG. 2). In some other embodiments, the etch may extend through the hard mask 112 to an uppermost surface of the memory element 110 (see, for example, FIG. 5). In yet other embodiments, the etch may extend through the hard mask 112 and into an uppermost surface of the memory element 110 (see, for example, 136 of FIG. 5 and/or 138 of FIG. 6).

In some embodiments, a profile of the etch may be angled such that angles between sidewalls of the first dielectric layer 114 that define the first opening 1204 and an upper surface of the hard mask 112 are greater than 90 degrees (see, for example, 134 of FIG. 2).

The sidewalls of the first dielectric layer 114 that define the first opening 1204 are laterally set back from the sidewalls of the memory element 110. A distance between the sidewalls of the first dielectric layer 114 that define the first opening 1204 (i.e., a width of the first opening 1204) is less than a distance between the sidewalls of the memory element 110 (i.e., is less than the width of the memory element 110). In some embodiments, a ratio of the width of the first opening 1204 (e.g. along y-axis 101y) to a width of the memory element 110 is less than 0.5, is about 0.1 to 0.5, or is some other suitable value.

Figure 13:
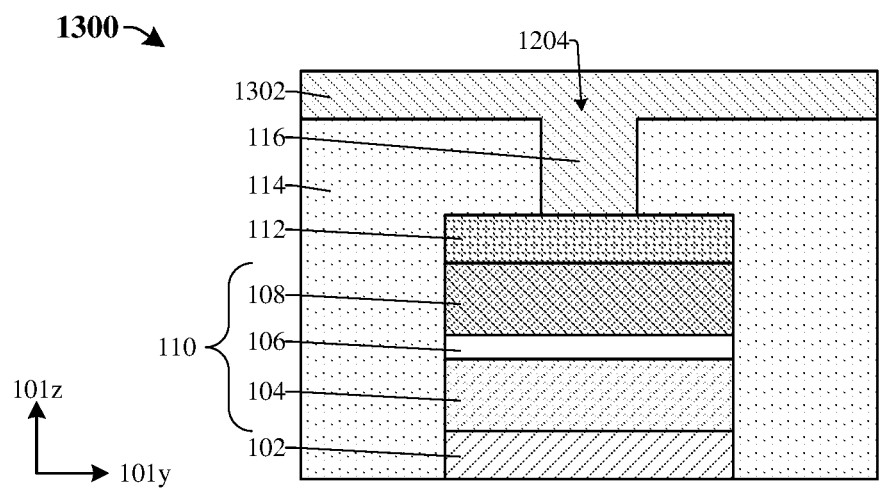

As shown in cross-sectional view 1300 of FIG. 13, a second conductive layer 1302 is formed over the first dielectric layer 114, directly over the hard mask 112, and in the first opening 1204 to form a top electrode 116 directly over the hard mask 112 and in the first opening 1204. In some embodiments, the second conductive layer 1302 may, for example, be formed by depositing copper, some copper-aluminum alloy, or some other suitable material by a sputtering process, an electrochemical deposition process, an electroless deposition process, or some other suitable process.

Figure 14:
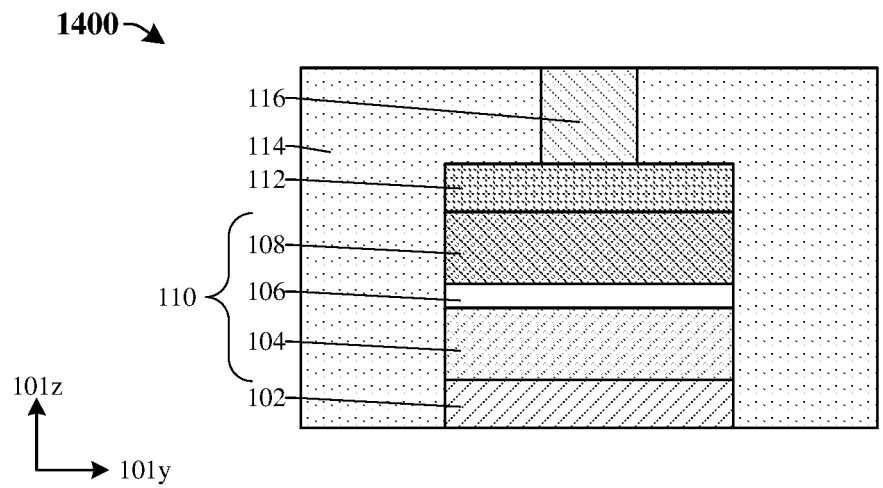

As shown in cross-sectional view 1400 of FIG. 14, a planarization process is performed on the second conductive layer 1302 to remove the second conductive layer 1302 from over the first dielectric layer 114 and to further define the top electrode 116. In some embodiments, the planarization process is also performed on the first dielectric layer 114. In some embodiments, an uppermost surface of the top electrode 116 and uppermost surfaces of the first dielectric layer 114 are coplanar after the planarization process is performed. In some embodiments, the planarization process may, for example, comprise a chemical mechanical planarization (CMP) process or some other suitable process.

Figure 15:
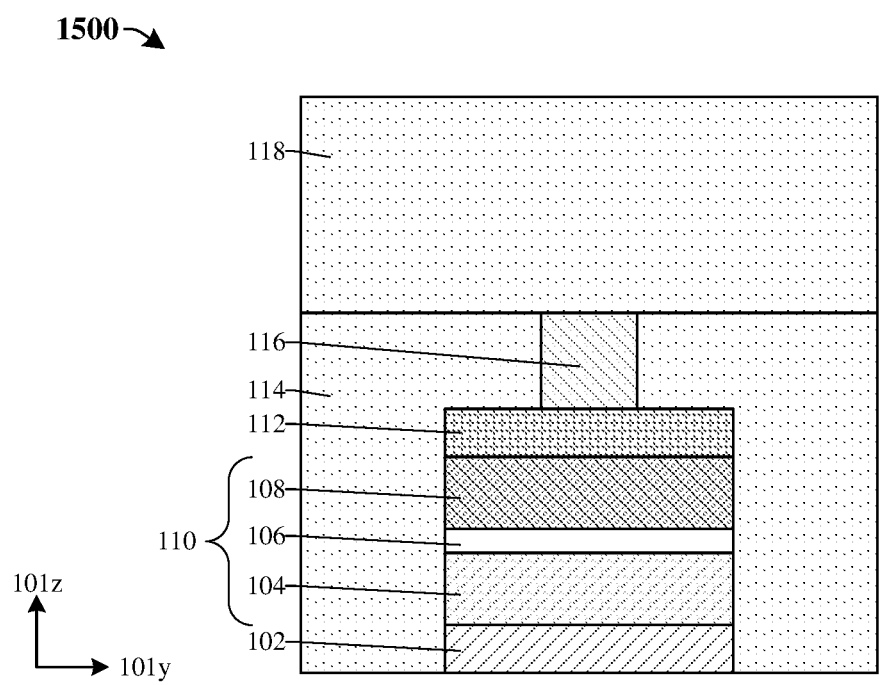

As shown in cross-sectional view 1500 of FIG. 15, a second dielectric layer 118 is formed directly over the first dielectric layer 114 and directly over the top electrode 116. In some embodiments, the second dielectric layer 118 may, for example, be formed by depositing silicon dioxide, silicon nitride, silicon carbide, silicon oxycarbide, silicon oxynitride, or some other suitable material by a CVD process, a PVD process, an ALD process, or some other suitable process.

Figure 16:
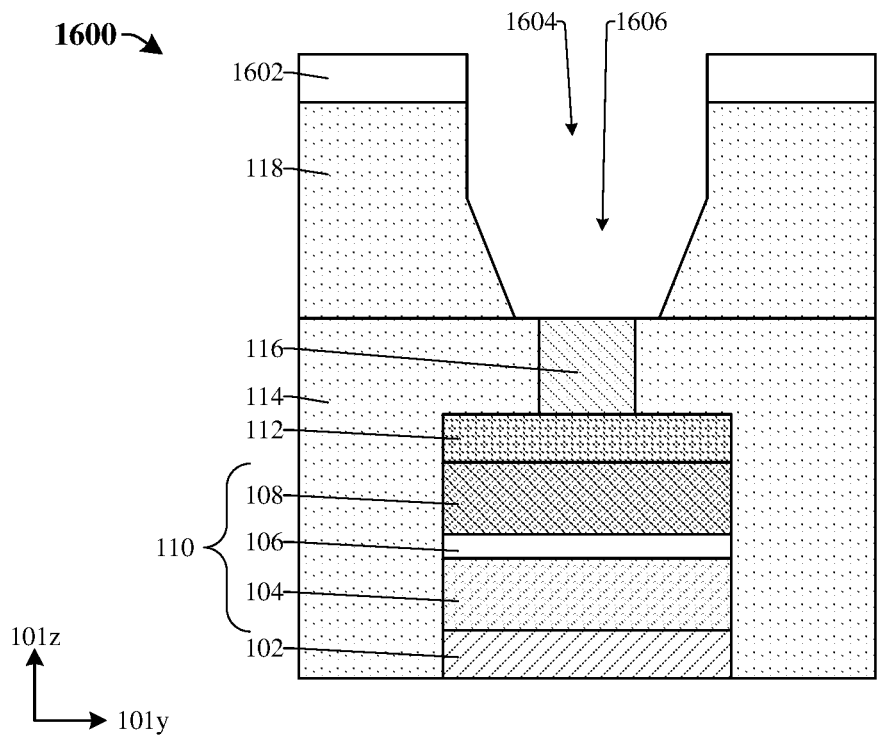

As shown in cross-sectional view 1600 of FIG. 16, a second masking layer 1602 is formed over the second dielectric layer 118. The second dielectric layer 118 is then etched according to the second masking layer 1602 to form a second opening 1604 and a third opening 1606 in the second dielectric layer 118. In some embodiments, the second opening 1604 and the third opening 1606 are directly over the top electrode 116 and uncover an upper surface of the top electrode 116. In some embodiments, the second opening 1604 is a trench opening and the third opening 1606 is a via opening. In some embodiments, the second opening 1604 is formed by a first etching process while the third opening 1606 is formed by a second etching process, or vice versa.

In some embodiments, the second masking layer 1602 may, for example, be or comprise a photoresist mask, a hard mask, or the like. In some embodiments, the etching may, for example, comprise a dry etching process or some other suitable process. In some embodiments, the second masking layer 1602 is removed after the etching.

Figure 17:
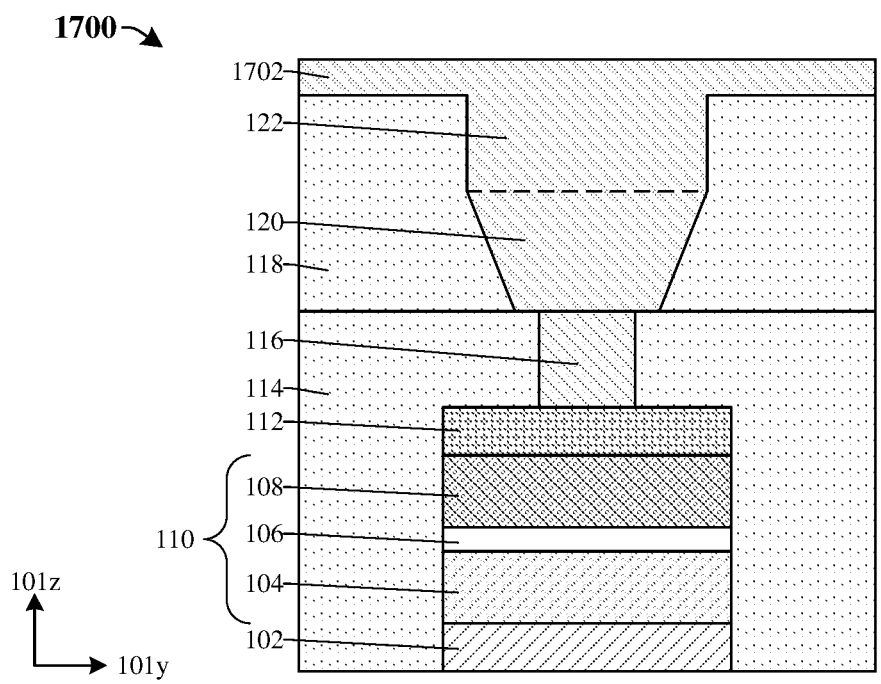

As shown in cross-sectional view 1700 of FIG. 17, a third conductive layer 1702 is formed over the second dielectric layer 118, directly over the top electrode 116, in the second opening 1604, and in the third opening 1606 to form a conductive via 120 in the third opening 1606 and directly over the top electrode 116, and to form a first conductive line 122 in the second opening 1604 and directly over the conductive via 120. In some embodiments, the third conductive layer 1702 may, for example, be formed by depositing titanium nitride, tantalum nitride, tungsten, copper, or some other suitable material by a sputtering process, an electrochemical deposition process, an electroless deposition process, or some other suitable process.

Figure 18:
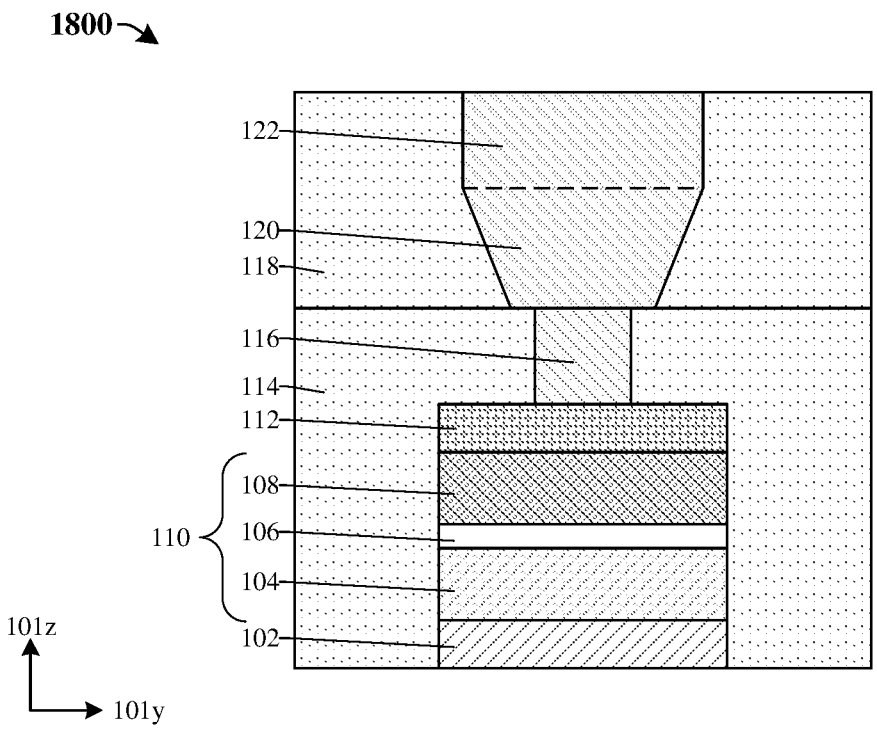

As shown in cross-sectional view 1800 of FIG. 18, a planarization process is performed on the third conductive layer 1702 to remove the third conductive layer 1702 from over the second dielectric layer 118 and to further define the first conductive line 122. In some embodiments, the planarization process is also performed on the second dielectric layer 118. In some embodiments, an uppermost surface of the first conductive line 122 and uppermost surfaces of the second dielectric layer 118 are coplanar after the planarization process is performed. In some embodiments, the planarization process may, for example, comprise a CMP process or some other suitable process.

Figure 19:
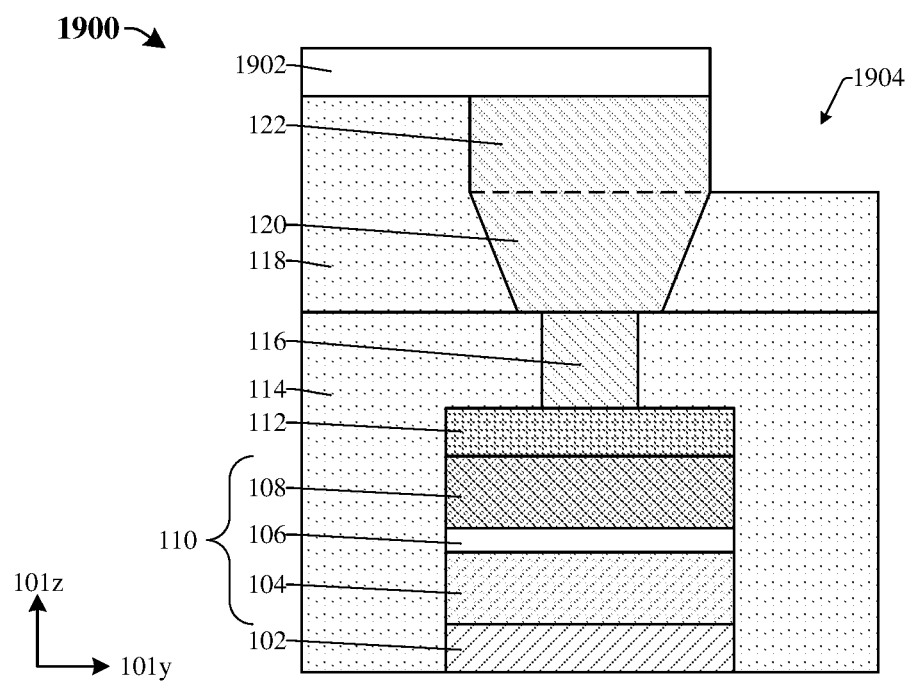

As shown in cross-sectional view 1900 of FIG. 19, a third masking layer 1902 is formed over the second dielectric layer 118 and over the first conductive line 122. The second dielectric layer 118 is then etched according to the third masking layer 1902 to form a fourth opening 1904 in the second dielectric layer 118. In some embodiments, the fourth opening 1904 is adjacent to the first conductive line 122 and uncovers a sidewall of the first conductive line 122.

In some embodiments, the third masking layer 1902 may, for example, be or comprise a photoresist mask, a hard mask, or the like. In some embodiments, the etching may, for example, comprise a dry etching process or some other suitable process. In some embodiments, the third masking layer 1902 is removed after the etching.

Figure 20:
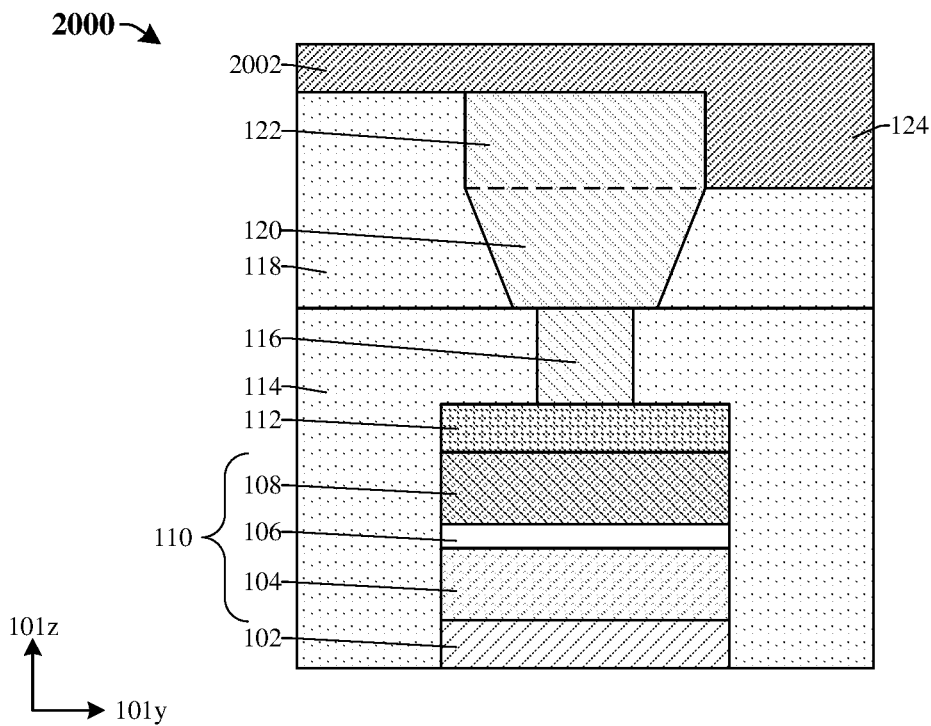

As shown in cross-sectional view 2000 of FIG. 20, a fourth conductive layer 2002 is formed over the second dielectric layer 118, over the first conductive line 122, and in the fourth opening 1904 to form a source line 124 in the fourth opening 1904 and on the sidewall of the first conductive line 122. In some embodiments, the fourth conductive layer 2002 may, for example, be formed by depositing titanium nitride, tantalum nitride, tungsten, copper, or some other suitable material by a sputtering process, an electrochemical deposition process, an electroless deposition process, or some other suitable process.

Figure 21:
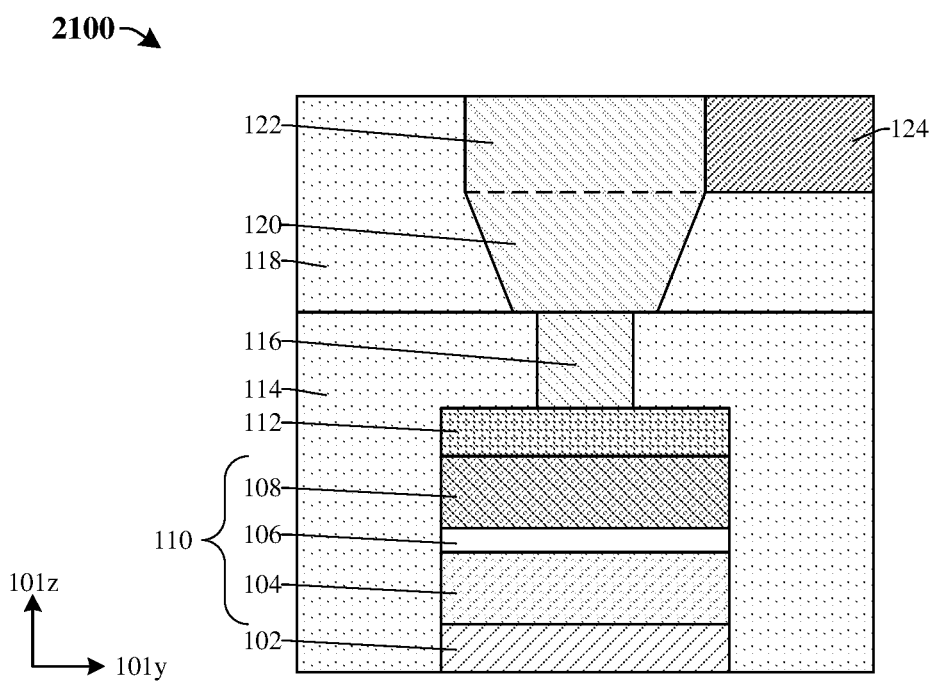

As shown in cross-sectional view 2100 of FIG. 21, a planarization process is performed on the fourth conductive layer 2002 to remove the fourth conductive layer 2002 from over the second dielectric layer 118 and from over the first conductive line 122. In addition, the planarization process further defines the source line 124. In some embodiments, the planarization process is also performed on the second dielectric layer 118 and/or the first conductive line 122. In some embodiments, an uppermost surface of the source line 124, an uppermost surface of the first conductive line 122, and one or more uppermost surfaces of the second dielectric layer 118 are coplanar after the planarization process is performed. In some embodiments, the planarization process may, for example, comprise a CMP process or some other suitable process.

Figure 22:
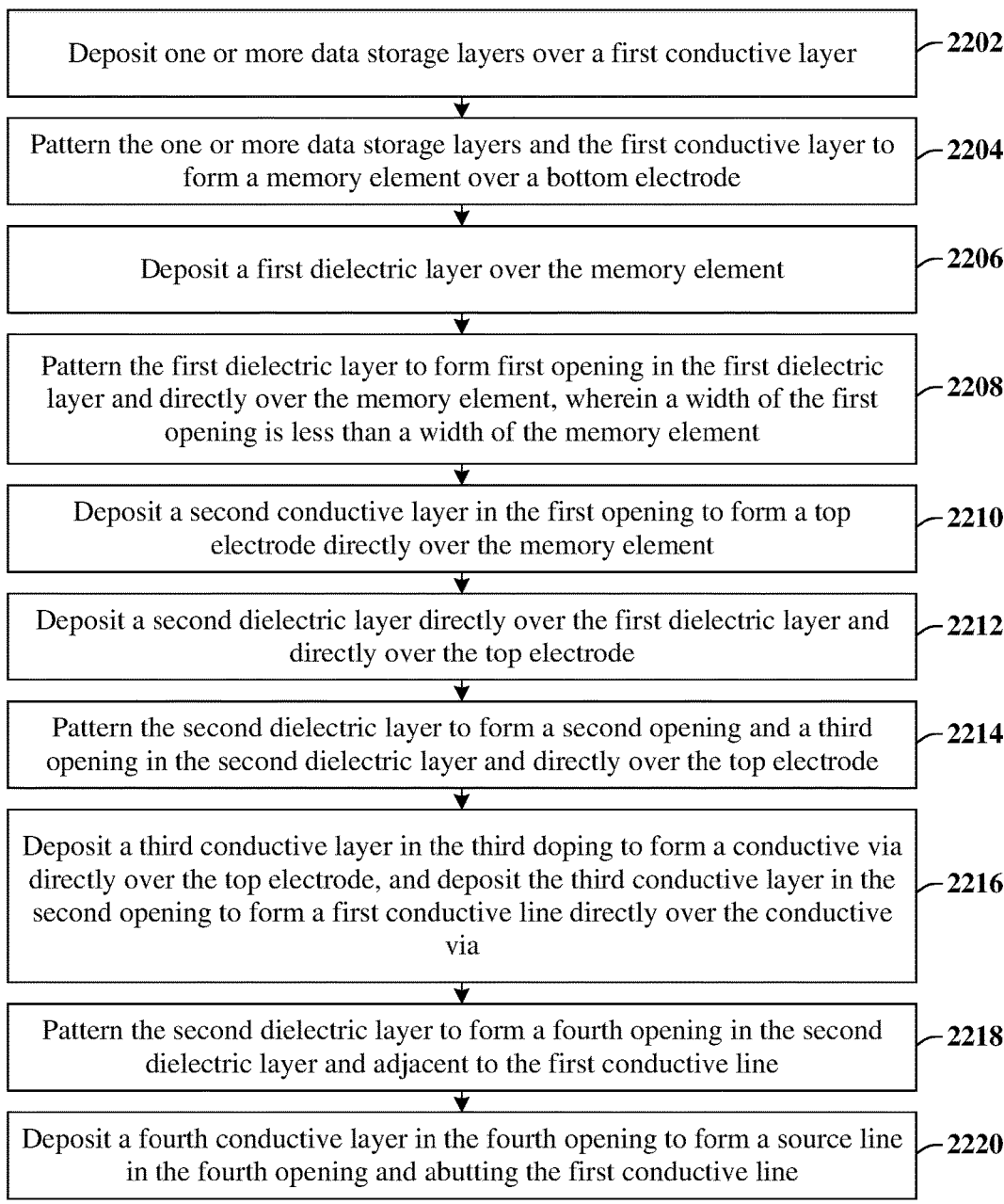
FIG. 22 illustrates a flow diagram of some embodiments of a method for forming a memory device comprising a top electrode over a memory element and a source line coupled to the top electrode.

FIG. 22 illustrates a flow diagram of some embodiments of a method 2200 for forming a memory device comprising a top electrode over a memory element and a source line coupled to the top electrode. While method 2200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2202, one or more data storage layers are deposited over a first conductive layer. FIG. 9 illustrates a cross-sectional view 900 of some embodiments corresponding to act 2202.

At 2204, the one or more data storage layers and the first conductive layer are patterned to form a memory element over a bottom electrode. FIG. 10 illustrates a cross-sectional view 1000 of some embodiments corresponding to act 2204.

At 2206, a first dielectric layer is deposited over the memory element. FIG. 11 illustrates a cross-sectional view 1100 of some embodiments corresponding to act 2206.

At 2208, the first dielectric layer is patterned to form first opening in the first dielectric layer and directly over the memory element, wherein a width of the first opening is less than a width of the memory element. FIG. 12 illustrates a cross-sectional view 1200 of some embodiments corresponding to act 2208.

At 2210, a second conductive layer is deposited in the first opening to form a top electrode directly over the memory element. FIG. 13 illustrates a cross-sectional view 1300 of some embodiments corresponding to act 2210.

At 2212, a second dielectric layer is deposited directly over the first dielectric layer and directly over the top electrode. FIG. 15 illustrates a cross-sectional view 1500 of some embodiments corresponding to act 2212.

At 2214, the second dielectric layer is patterned to form a second opening and a third opening in the second dielectric layer and directly over the top electrode. FIG. 16 illustrates a cross-sectional view 1600 of some embodiments corresponding to act 2214.

At 2216, a third conductive layer is deposited in the third doping to form a conductive via directly over the top electrode, and the third conductive layer is deposited in the second opening to form a first conductive line directly over the conductive via. FIG. 17 illustrates a cross-sectional view 1700 of some embodiments corresponding to act 2216.

At 2218, the second dielectric layer is patterned to form a fourth opening in the second dielectric layer and adjacent to the first conductive line. FIG. 19 illustrates a cross-sectional view 1900 of some embodiments corresponding to act 2218.

At 2220, a fourth conductive layer is deposited in the fourth opening to form a source line in the fourth opening and abutting the first conductive line. FIG. 20 illustrates a cross-sectional view 2000 of some embodiments corresponding to act 2220.

Thus, the present disclosure relates to a memory device comprising a breakable top electrode over a memory element and a source line coupled to the top electrode for improving a performance of the memory device.

Accordingly, in some embodiments, the present disclosure relates to an integrated chip comprising a bottom electrode arranged within a dielectric layer. A memory element is directly over the bottom electrode and is arranged within the dielectric layer. A top electrode is directly over the memory element and is arranged within the dielectric layer. A conductive via is directly over the top electrode. A pair of lines that extend along opposing sidewalls of the top electrode are directly over, and intersect, an uppermost surface of the memory element. The pair of lines are directly under, and intersect, a lowermost surface of the via.

In other embodiments, the present disclosure relates to an integrated chip comprising a bottom electrode arranged within a dielectric layer. A memory element is directly over the bottom electrode and is arranged within the dielectric layer. A top electrode is directly over the memory element and is arranged within the dielectric layer. A first perimeter of a lowermost surface of the top electrode is arranged within a second perimeter of an uppermost surface of the memory element. A conductive via is directly over the top electrode. A first conductive line is directly over the conductive via and extends along a first direction. The first conductive line is disposed at a first height. A second conductive line is adjacent to the first conductive line. The second conductive line extends along a second direction transverse to the first direction. The second conductive line is arranged on a sidewall of the first conductive line.

In yet other embodiments, the present disclosure relates to a method for forming an integrated chip. The method comprises forming a memory element over a bottom electrode. A first dielectric layer is deposited over the memory element. The first dielectric layer is patterned to form a first opening in the first dielectric layer and directly over the memory element. A distance between sidewalls of the first dielectric layer that define the first opening is less than a width of the memory element. A first conductive material is deposited in the first opening to form a top electrode in the first opening and directly over the memory element. A second dielectric layer is deposited over the top electrode and over the first dielectric layer. The second dielectric layer is patterned to form a second opening in the second dielectric layer and directly over the top electrode. A second conductive material is deposited in the second opening to form a first conductive line that extends in a first direction and that is directly over the top electrode. The second dielectric layer is patterned to form a third opening in the second dielectric layer and adjacent to the first conductive line. A third conductive material is deposited in the third opening to form a source line on a sidewall of the first conductive line and extending in a second direction transverse to the first direction. The source line is electrically coupled to the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
   forming a memory element over a bottom electrode;
   depositing a first dielectric layer over the memory element;
   patterning the first dielectric layer to form a first opening in the first dielectric layer and directly over the memory element, wherein a distance between sidewalls of the first dielectric layer that define the first opening is less than a width of the memory element;
   depositing a first conductive material in the first opening to form a top electrode in the first opening and directly over the memory element;
   depositing a second dielectric layer over the top electrode and over the first dielectric layer;
   patterning the second dielectric layer to form a second opening in the second dielectric layer and directly over the top electrode;
   depositing a second conductive material in the second opening to form a first conductive line extending in a first direction and directly over the top electrode;
   patterning the second dielectric layer to form a third opening in the second dielectric layer and adjacent to the first conductive line; and
   depositing a third conductive material in the third opening to form a source line on a sidewall of the first conductive line and extending in a second direction transverse to the first direction, wherein the source line is electrically coupled to the top electrode.

2. The method of claim 1, wherein forming the memory element comprises depositing a first magnetic layer, depositing an insulator layer over the first magnetic layer, depositing a second magnetic layer over the insulator layer, forming a hard mask over the second magnetic layer, and patterning the second magnetic layer, the insulator layer, and the first magnetic layer according to the hard mask.

3. The method of claim 2, wherein patterning the first dielectric layer to form the first opening comprises an etch, and wherein the etch extends into the hard mask to below an uppermost surface of the hard mask.

4. The method of claim 3, wherein the etch extends through the hard mask to an uppermost surface of the memory element.

5. The method of claim 2, wherein the first conductive material is deposited on an upper surface of the hard mask, and wherein a lower surface of the top electrode is on the upper surface of the hard mask.

6. The method of claim 1, wherein depositing the second conductive material in the second opening forms a conductive via directly over the top electrode, wherein the first conductive line is over the conductive via.

7. The method of claim 6, wherein the conductive via is formed directly on a top surface of the top electrode.

8. A method for forming an integrated chip, the method comprising:
   forming a memory element over a bottom electrode;
   depositing a first conductive layer over the memory element to form a top electrode directly over the memory element, wherein a first sidewall and a second sidewall of the top electrode are directly over a top surface of the memory element;
   depositing a second conductive layer over the top electrode to form a conductive via directly over the top electrode, wherein the first sidewall and the second sidewall of the top electrode are directly under a bottom surface of the conductive via; and
   breaking the top electrode to establish an open circuit between the bottom electrode and the conductive via.

9. The method of claim 8, wherein the first conductive layer comprises a first metal, and wherein the second conductive layer comprises a second metal different than the first metal.

10. The method of claim 9, wherein the bottom electrode comprises the second metal.

11. The method of claim 8, wherein depositing the second conductive layer over the top electrode forms a first conductive line directly over the conductive via.

12. The method of claim 11, further comprising:
    forming a second conductive line on a sidewall of the first conductive line, wherein the first conductive line and the second conductive line are electrically coupled to the top electrode.

13. The method of claim 12, wherein the first conductive line is elongated in a first direction and the second conductive line is elongated in a second direction transverse to the first direction.

14. The method of claim 12, wherein forming the second conductive line comprises depositing a third conductive layer adjacent to the first conductive line.

15. The method of claim 8:
    wherein breaking the top electrode comprises providing a voltage to the top electrode to form a void along the top electrode, wherein the void establishes the open circuit between the bottom electrode and the conductive via.

16. The method of claim 8, further comprising:
    depositing a hard mask layer over the memory element, wherein the first conductive layer is deposited over the hard mask layer, and wherein the first sidewall and the second sidewall of the top electrode are directly over an upper surface of the hard mask layer.

17. A method for forming an integrated chip, the method comprising:
    depositing a first magnetic layer over a bottom electrode layer;
    depositing an insulator layer over the first magnetic layer;
    depositing a second magnetic layer over the insulator layer;
    forming a hard mask over the second magnetic layer;
    etching the second magnetic layer, the insulator layer, the first magnetic layer, and the bottom electrode layer according to the hard mask;
    forming a first dielectric layer and a top electrode directly over the hard mask, the top electrode between a first sidewall and a second sidewall of the first dielectric layer;
    forming a second dielectric layer and a conductive via directly over the first dielectric layer, the conductive via between a first sidewall and a second sidewall of the second dielectric layer, and the conductive via directly overlying the top electrode; and
    forming a first conductive line directly over the conductive via.

18. The method of claim 17, further comprising:
    forming a second conductive line adjacent to the first conductive line and electrically coupled to the first conductive line.

19. The method of claim 17, wherein a first perimeter of a lowermost surface of the top electrode is arranged within a second perimeter of an uppermost surface of the hard mask.

20. The method of claim 17, wherein the first sidewall and the second sidewall of the first dielectric layer extend from a top surface of the hard mask to a bottom surface of the conductive via.

* * * * *